(12) United States Patent
Bang et al.

(10) Patent No.: US 6,682,959 B2
(45) Date of Patent: Jan. 27, 2004

(54) ARCHITECTURE OF LASER FUSE BOX OF SEMICONDUCTOR INTEGRATED CIRCUIT AND METHOD FOR FABRICATING THE SAME

(75) Inventors: Kwang-Kyu Bang, Yongin (KR); Sang-Gil Kim, Yongin (KR); Myoung-Sub Kim, Suwon (KR); Ho-Jeong Choi, Suwon (KR)

(73) Assignee: Samsung Electronics Co., Ltd., Suwon (JP)

( * ) Notice: Subject to any disclaimer, the term of this patent is extended or adjusted under 35 U.S.C. 154(b) by 0 days.

(21) Appl. No.: 10/367,556

(22) Filed: Feb. 13, 2003

(65) Prior Publication Data
US 2003/0119227 A1 Jun. 26, 2003

Related U.S. Application Data

(62) Division of application No. 09/710,231, filed on Nov. 10, 2000, now Pat. No. 6,541,290.

(30) Foreign Application Priority Data

Nov. 10, 1999 (KR) .......................... 1999-49613

(51) Int. Cl.[7] ............................................... H01L 21/00
(52) U.S. Cl. ........................ 438/132; 438/130; 257/208; 257/209
(58) Field of Search ................. 257/208, 209; 438/130, 132

(56) References Cited

U.S. PATENT DOCUMENTS

| | | | | |
|---|---|---|---|---|
| 5,679,967 A | | 10/1997 | Janai et al. .................. 257/209 |
| 5,747,869 A | * | 5/1998 | Prall et al. ................... 257/529 |
| 5,933,382 A | | 8/1999 | Yi et al. .................... 365/225.7 |
| 6,172,896 B1 | | 1/2001 | Lee ............................. 365/96 |
| 6,180,503 B1 | * | 1/2001 | Tzeng et al. ................. 438/601 |
| 6,210,995 B1 | * | 4/2001 | Brintzinger et al. ......... 438/132 |
| 6,265,778 B1 | | 7/2001 | Tottori ......................... 257/758 |
| 6,272,061 B1 | | 8/2001 | Kato et al. ................ 365/225.7 |
| 6,373,772 B2 | | 4/2002 | Kato et al. ................ 365/225.7 |
| 6,395,622 B1 | | 5/2002 | Liu et al. ..................... 438/497 |
| 6,541,290 B1 | * | 4/2003 | Bang et al. .................... 438/22 |

FOREIGN PATENT DOCUMENTS

DE        101 12 543 A1  *  2/2002

* cited by examiner

*Primary Examiner*—Richard Elms
*Assistant Examiner*—Christian D. Wilson
(74) *Attorney, Agent, or Firm*—Marger Johnson & McCollom, P.C.

(57) ABSTRACT

The invention relates to a fuse layout structure in a laser fuse box of a semiconductor integrated circuit and a method for fabricating the same. In one example of the invention, the fuse layout structure in a laser fuse box of the semiconductor integrated circuit includes a plurality of fuses with the central regions thereof extending parallel to each other within the fuse box, and the central regions of the fuses being covered with an insulative protection layer. Thus, the fuse layout structure of the present invention occupies a minimum area in the chip while minimizing influences of the heat generated by fusing neighboring fuses.

15 Claims, 12 Drawing Sheets

ARCHITECTURE OF LASER FUSE BOX OF SEMICONDUCTOR INTEGRATED CIRCUIT AND METHOD FOR FABRICATING THE SAME

This application is a divisional of U.S. patent application Ser. No. 09/710,231 filed on Nov. 10, 2000, now U.S. Pat. No. 6,541,290, which is herein incorporated by reference in its entirety.

BACKGROUND OF THE INVENTION

1. Field of the Invention

The present invention relates to a semiconductor device and, more particularly, to a layout structure of fuses in a laser fuse box of a semiconductor integrated circuit and a method for fabricating the same.

2. Brief Description of the Related Art

Numerous semiconductor chips are first fabricated on a semiconductor wafer. The semiconductor chips are tested for proper functionality when they are still regions of the semiconductor wafer on which they are manufactured. In particular, in order to determine whether all the circuit elements of each chip properly operate according to the preset specifications, a variety of tests are performed with various test parameters to determine electrical properties and functions of the chips. If any one of control circuits is found defective in the semiconductor memory chip, it is practically impossible to remove a defect found in the semiconductor memory device. On the contrary, if the defect is found in a memory cell of memory cell arrays, a repair process is performed to replace the defective cell with a redundant memory cell. In other words, if a region of normal memory cells is found defective, a region of spare memory cells, which have previously formed as redundancy cells, can be substituted for the defective region of the normal memory cells, so that the semiconductor memory device can perform normal operations.

In order to remove one or more such defective cells, fuse circuits are provided comprising a plurality of fuses simultaneously fabricated with the memory cells and circuit elements of the semiconductor memory device, as shown in FIG. 1A. The fuses are cut by various conventional techniques such as a laser beam cutting technique, as required, to remove defective cells and to replace them with redundant functional cells.

FIG. 1A illustrates a redundant fuse circuit in a conventional semiconductor memory device, which has been published on Aug. 3, 1999 and disclosed in U.S. Pat. No. 5,933,382. As show in FIG. 1A, a low redundant fuse circuit consists of a pre-charge transistor 30, a status-maintaining circuit 40, a laser fuse box 50, a pass transistor array 60 and a redundancy signal-generating circuit 70.

In FIG. 1A, the laser fuse box 50 consisting of a plurality of fuses F1, F2 . . . Fn is connected through the redundancy signal generating circuit 70 with control circuits such as decoders of the semiconductor memory device. The control circuits are connected with normal and redundancy memory cells or blocks.

It will be understood that fuse programming has been performed by previously opening or blowing the fuses corresponding to an address of a defective memory cell among fuses F1, F2 . . . Fn in the fuse box 50. According to a fuse programming technique, the redundancy signal-generating circuit 70 activates a signal REDi only when an address corresponding to a defective memory cell is transmitted to address bits of Rai, RaiB, Raj, RajB, . . . Ran, RanB during the normal operations of a semiconductor memory device. Accordingly, in place of the defective memory cell or block, a redundancy memory cell or block is selected to write/read data. The aforementioned fuse programming is a kind of address code cutting process for repairing a defective memory cell or block.

In other words, when a memory cell is found defective, the redundancy fuse circuit, which has been previously fabricated as shown in FIG. 1A, opens a fuse relevant to the address line of the defective memory cell. As a result, a redundancy memory cell is substituted for the defective memory cell.

To fuse, or open a fuse, in the aforementioned fuse box 50 of the conventional semiconductor memory device, there has been provided an electrical fusing method in which a large quantity of current flows for fusing and a laser fusing method in which a laser beam radiates the fuse and thereby opens ("blow") it.

Electrical fusing often has been utilized in the semiconductor memory device such as an Electrical Erasable Programmable Read Only Memory (EEPROM). On the other hand, laser fusing has been utilized primarily in semiconductor memory devices such as a Dynamic Random Access Memory (DRAM).

The fuse box in the redundant fuse circuit typically is configured at a periphery circuit area of a chip. Along with the recent trend of reducing the size of a chip, it is necessary to develop a technique to configure and fabricate the fuse box to occupy as a small area as possible.

FIGS. 1B and 1C illustrate layout structures of a semiconductor memory device in accordance with recent advances. FIG. 1B illustrates a method for fabricating the layout structure of fuses in accordance with the teachings of Korean patent application No. 1998-47293.

As shown in FIG. 1B, laser fuses 111–116 contained in the fuse box 50 of the conventional semiconductor memory device have all the same width W1 and pitch P1. In general, the center region 131 of the laser fuses is where the laser beam is irradiated for fusing. As the size of semiconductor memory chips gets smaller, there should be a reduction in pitch to accommodate the laser fuses 111–116 in the smaller chip. Particularly, as the pitch of the laser fuses gets smaller, other laser fuses adjacent to a particular laser fuse to be cut or blown may be damaged by the fusing (cutting) step. As shown in FIG. 3B, the cross-sectional view taken along line X–X' of FIG. 3A, neighboring fuses may have a high probability of being damaged or having electrical shorts therebetween. FIG. 3B illustrates a profile of defects that may practically occur in programming a laser fuse box of a conventional semiconductor memory device.

On the other hand, FIG. 1C illustrates a layout structure of fuses in a laser fuse box of a semiconductor memory device in accordance with a prior art embodiment.

FIG. 1C is a fuse layout disclosed in U.S. Pat. No. 5,747,869 issued May 5, 1998. As shown in FIG. 1C, the laser fuses 151–156 have narrow closely spaced regions 151a–156a and wide space-apart regions 151b–156b. In the aforementioned structure, the fusing process is performed on the fuses 151–153 in wide regions 151b–153b and on the fuses 154–156 in wide regions 154b–156b so as to reduce the probability of damage to neighboring laser fuses. Although the aforementioned patent shows a laser fuse bank structure that is less susceptible of damaging neighboring fuses, laser fuses may be seen to occupy a large area of the chip due to the width and separation of the laser fuses.

FIG. 2 illustrates the layout structure of fuses in a laser fuse box of a semiconductor memory device in accordance with a further improved prior art embodiment. FIG. 2 illustrates a fuse layout disclosed in Korean Pat. No. 1998-47293. In the layout structure shown in FIG. 2, the empty spaces S1, S2 of FIG. 1C have been eliminated to reduce wasted space and to improve the integration of the laser fuses. However, the regions where fusing is performed in the fuse box shown in FIGS. 1C and 2, are near the top or bottom of the fuses rather than the center region. The width PW of the center region of the fuses is smaller than that of the top or bottom regions of the fuses where fusing occurs. This unfortunately has resulted in a relatively poor condition for fusing. Therefore, it is desirable that the center region of the fuse be protected so as to improve reliability of the product.

As described above, the conventional techniques have focused on the layout structure of fuses in the fuse box to improve integration of the device. However, there has not been sufficient consideration regarding electrical shorts that can be caused by thermal transfer among neighboring fuses. The inventors of the present invention have found new causes to degrade the reliability of the fusing process. The causes can be understood with reference to the accompanying drawing of FIG. 4 and relevant descriptions regarding yet another prior art layout structure.

FIG. 4 illustrates another prior art layout structure of fuses in a laser fuse box of a semiconductor memory device, specifically showing the arrangement of fuses outside the fuse boxes 10, 20.

As shown in FIG. 4, a gap between adjacent fuses is known to be smaller in region B with fuses 11, 12, 21, 22 outside the fuse boxes 10 and 20 than in region A with fuses 21, 22, 23, 24 and than fuses 11, 12, 13, 14 inside the fuse boxes 10 and 20, respectively. The gap is larger in region A than in region B because region A is where a fusing process is performed by a laser beam. When the laser beam irradiates for fusing (blowing) the fuse box shown in FIG. 4, heat is generated and transferred along the layout structure from the inside of the fuse boxes to the outside of the fuse boxes. As shown in FIG. 4, because the gap in region B is smaller, an insulating layer formed between fuses in region B is more vulnerable to the heat generated from the fusing process than the insulating layer formed between fuses in region A. Thus, the insulating layer can be easily destroyed. This causes electrical shorts between neighboring fuses. The electrical shorts between fuses most often occur outside the fuse boxes. But if the gap is sufficiently small within the fuse boxes, then shorts may also occur within the fuse boxes.

Therefore, there is a strong need to develop a technique to improve the layout structure of the fuse box, which preferably would occupy a minimum area in the chip for conveniently performing the fusing process while minimizing influences of the heat generated by fusing neighboring fuses.

SUMMARY OF THE INVENTION

Therefore, one object of the present invention is to provide a layout structure of a laser fuse box, which can solve a electrical shorting problem between neighboring fuses in a fusing process, and a method for fabricating the layout structure and for performing a fusing process.

Another object of the present invention is to provide an improved fuse layout structure in a laser fuse box to increase integration degree of a semiconductor integrated circuit and prevent or minimize thermal damage to neighboring fuses.

A further object of the present invention is to provide a fuse layout structure in a fuse box and a method for fabricating the same to occupy a smaller area, but to conveniently perform a fusing process with a minimum thermal influence on the neighboring fuses.

Another object of the present invention is to provide an improved fuse layout structure in a fuse box and a method for fabricating the same, in which a fusing process is selectively performed to laser fuses in a zigzag manner to reduce thermal damage to neighboring fuses.

In order to accomplish the aforementioned objects of the present invention, there is provided a fuse layout structure in a laser fuse box of a semiconductor integrated circuit in accordance with one aspect of the present invention, the structure comprising: a first plurality of conductive fuses each having a straight shape and a predetermined gap therebetween; and a second plurality of conductive fuses each having a vertical run, a bend and a horizontal run, wherein the second plurality of fuses are spaced apart with the first plurality of fuses therebetween.

In accordance with another aspect of the present invention, there is provided a fuse layout structure within a laser fuse box of a semiconductor integrated circuit, comprising: a plurality of neighboring fuses formed with a predetermined gap therebetween to create fuse locations arranged in a staggered configuration, the fuse comprising: a first conductive region extending from one edge of the width of the fuse box to an approximate center line of the fuse box; a second conductive region extending longitudinally from an end of the first region; and a third conductive region extending from an end of the second region to the edge of the fuse box.

In accordance with another aspect of the present invention, there is provided a fuse layout structure in a laser fuse box of a semiconductor integrated circuit comprising:
a plurality of laser fuses formed with a predetermined gap therebetween in the fuse box, the fuses having a central region extending parallel to each other; and
an insulative protection line extending longitudinally within the fuse box to cover the central regions of the fuses and insulating layers formed therebetween to prevent thermal damages to neighboring fuses when a fusing process is selectively performed on the laser fuses in a zigzag manner.

In accordance with another aspect of the present invention, there is provided a method for fabricating a laser fuse box of a semiconductor integrated circuit comprising the steps of: depositing a first insulating layer over a semiconductor substrate having electronic circuit elements thereon; depositing and patterning a silicon layer on a first insulating layer to form a plurality of laser fuses; forming a second insulating layer on the fuses; selectively etching the second insulating layer to a predetermined depth to form windows that define the fuse box; and selectively depositing a third insulating layer in the central regions of the fuses in the windows.

The fuse layout structure in a laser fuse box of a semiconductor integrated circuit in accordance with the present invention is advantageous over prior art fuse layout structure in that it occupies a smaller area. And the fuse layout structure of the present invention allows a fusing process to be performed easily and prevents or minimizes thermal damage to neighboring fuses during the fusing process. Therefore, the probability of electrical shorts between fuses can be minimized and reliability of repairing processes can be improved.

BRIEF DESCRIPTION OF THE DRAWINGS

For fuller understanding of the nature and objects of the present invention, reference should be made to the following detailed description taken in conjunction with the accompanying drawings in which.

DETAILED DESCRIPTION OF THE INVENTION

Figure 1A:
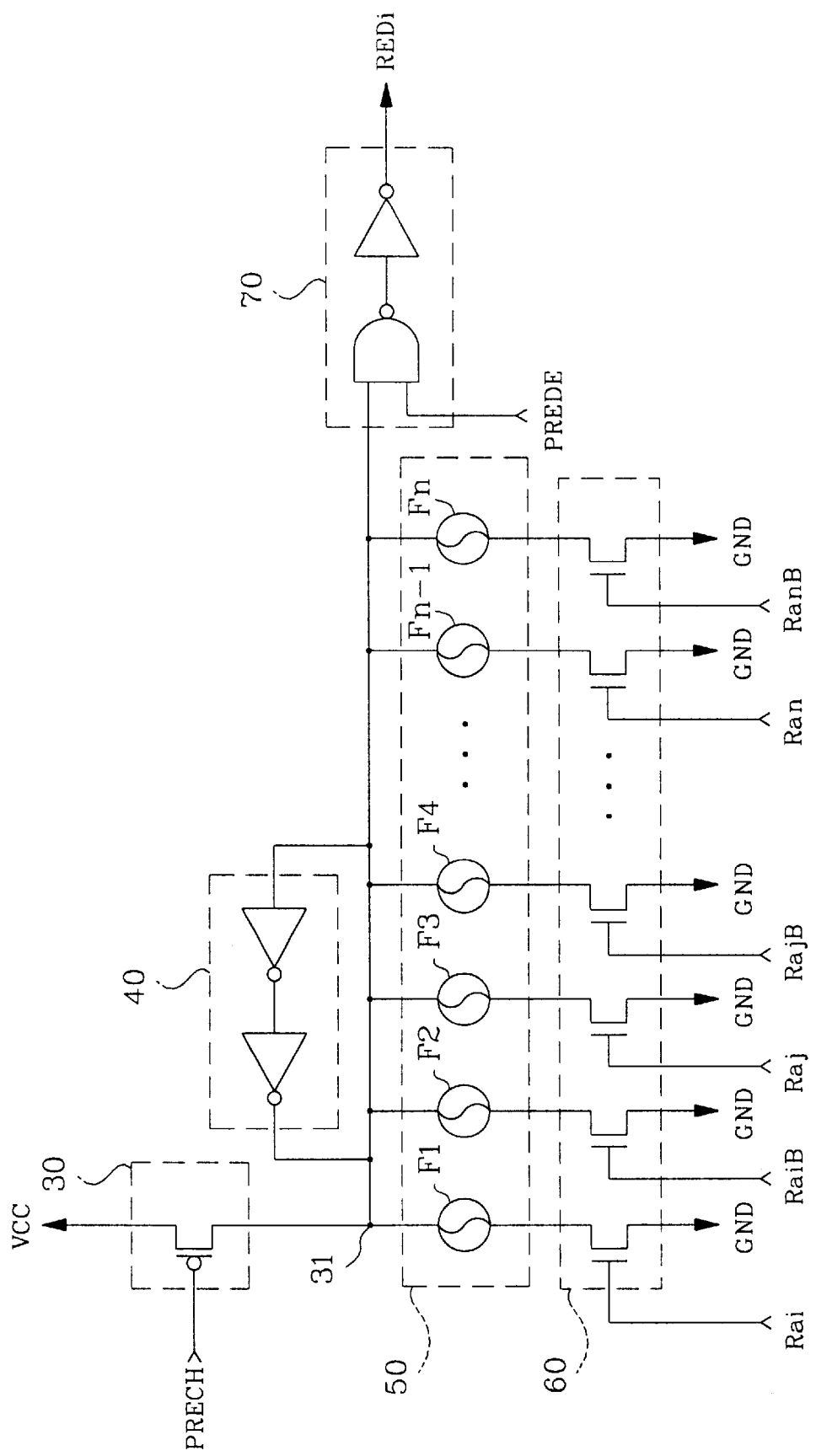
FIG. 1A is a schematic diagram illustrating a circuit of redundant cell fuses of a conventional semiconductor memory device.
Figure 1B:
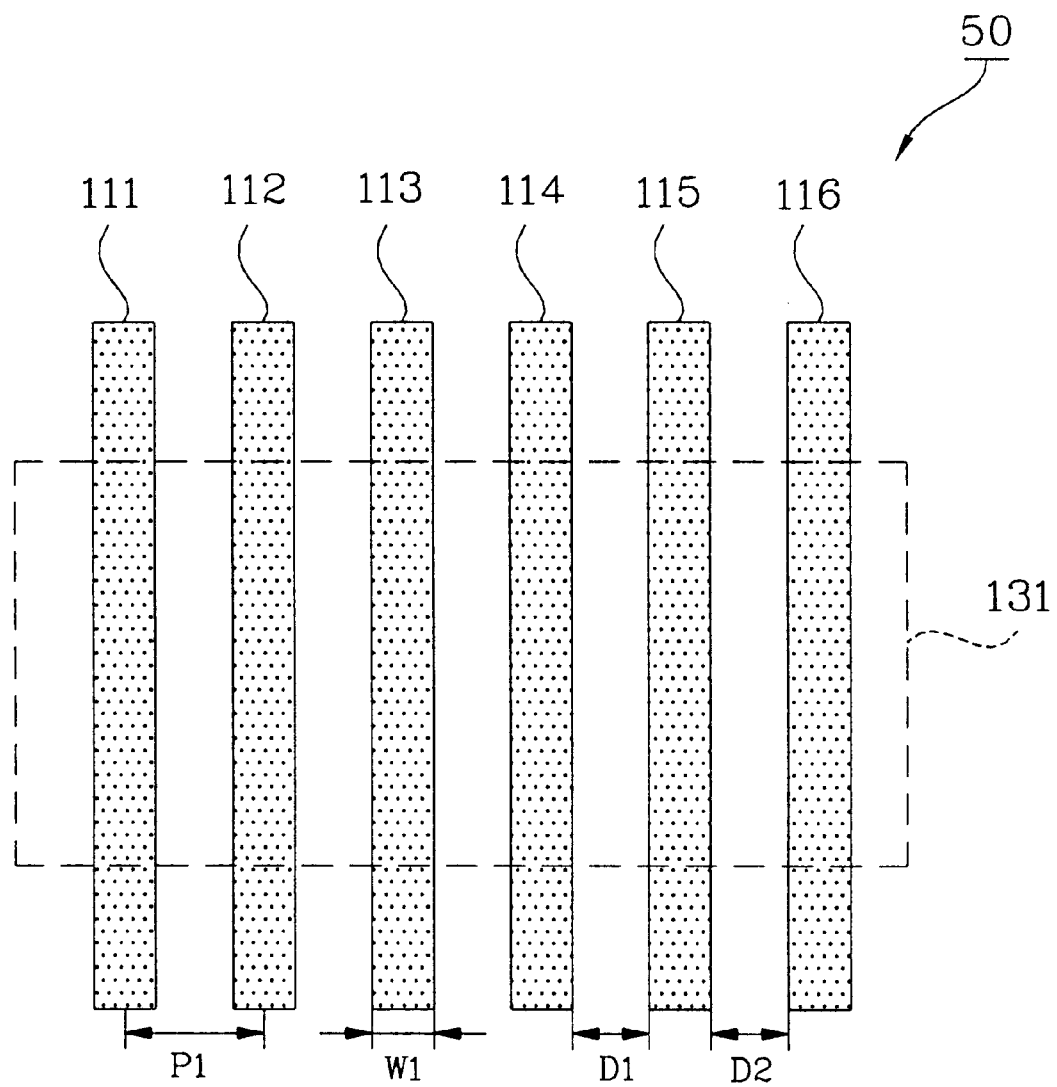
FIGS. 1B and 1C are plan views illustrating the layout structure of fuses in a laser fuse box of a semiconductor memory device in accordance with the prior art.
Figure 1C:
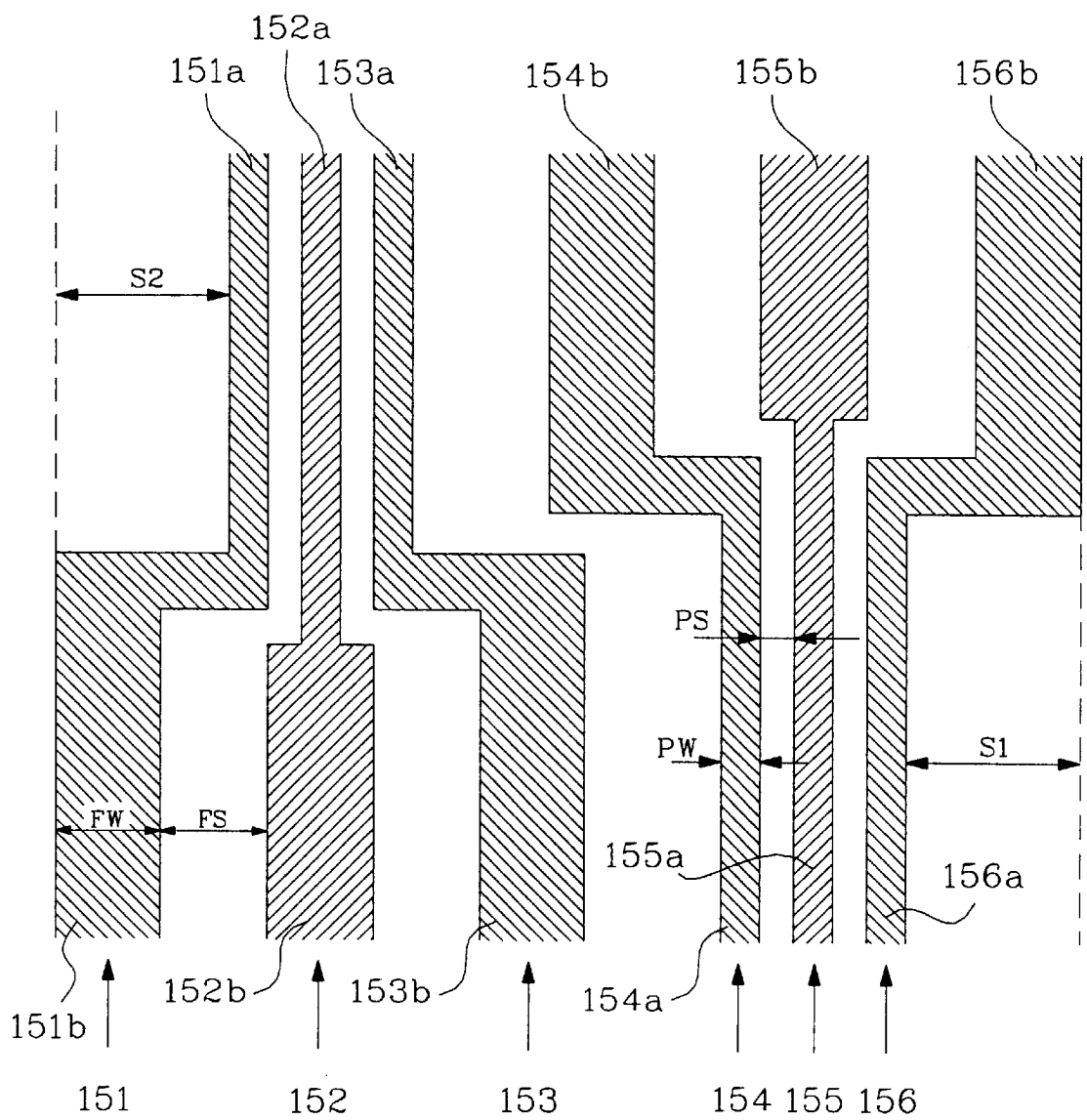
Figure 2:
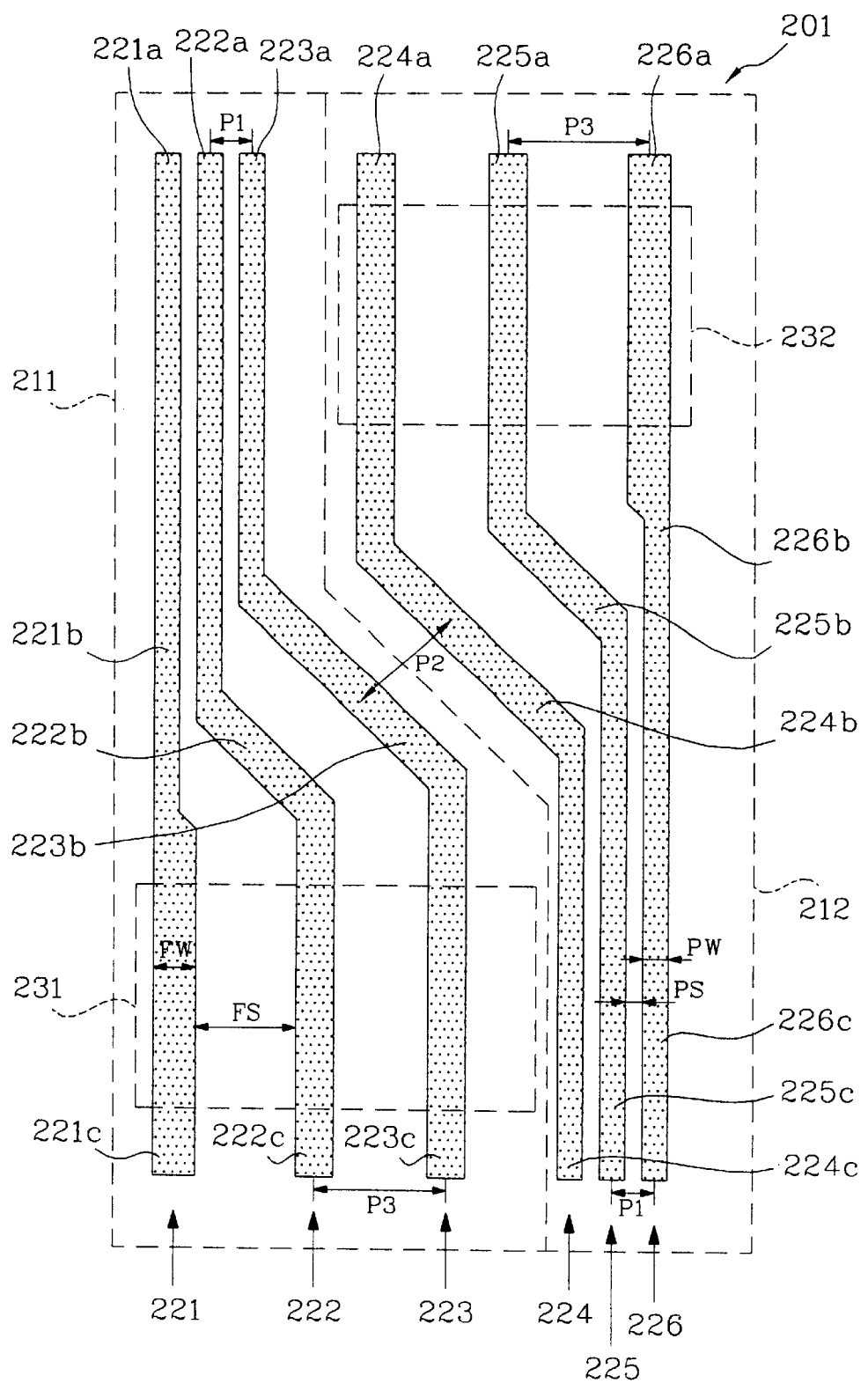
FIG. 2 is a plan view illustrating a layout structure of fuses in a laser fuse box of a semiconductor memory device in accordance with the prior art.

The objects, characteristics and operational effects of the present invention will be more apparent from detailed descriptions of preferred embodiments of the present invention with reference to the accompanying drawings. It should be noted that the same reference numerals are applied to identical or similar features in the drawings for the sake of convenience.

Figure 4:
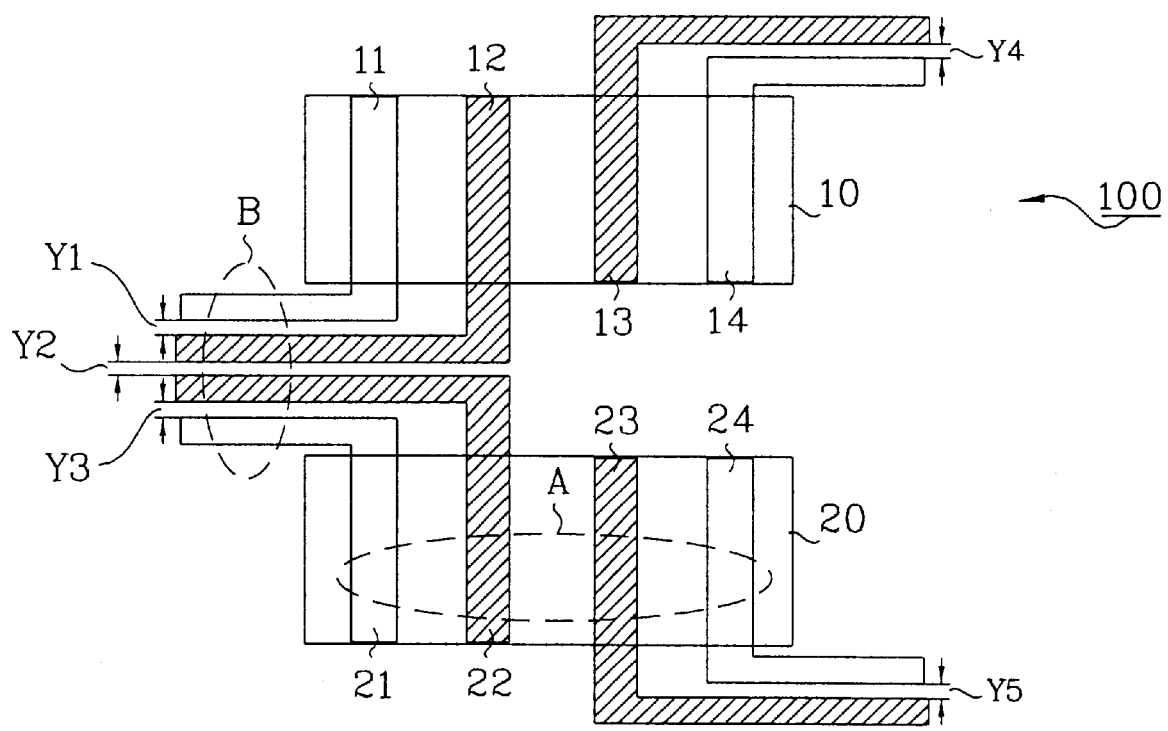
FIG. 4 is a plan view illustrating the layout structure of fuses in a laser fuse box of a semiconductor memory device in accordance with the prior art.
Figure 6:
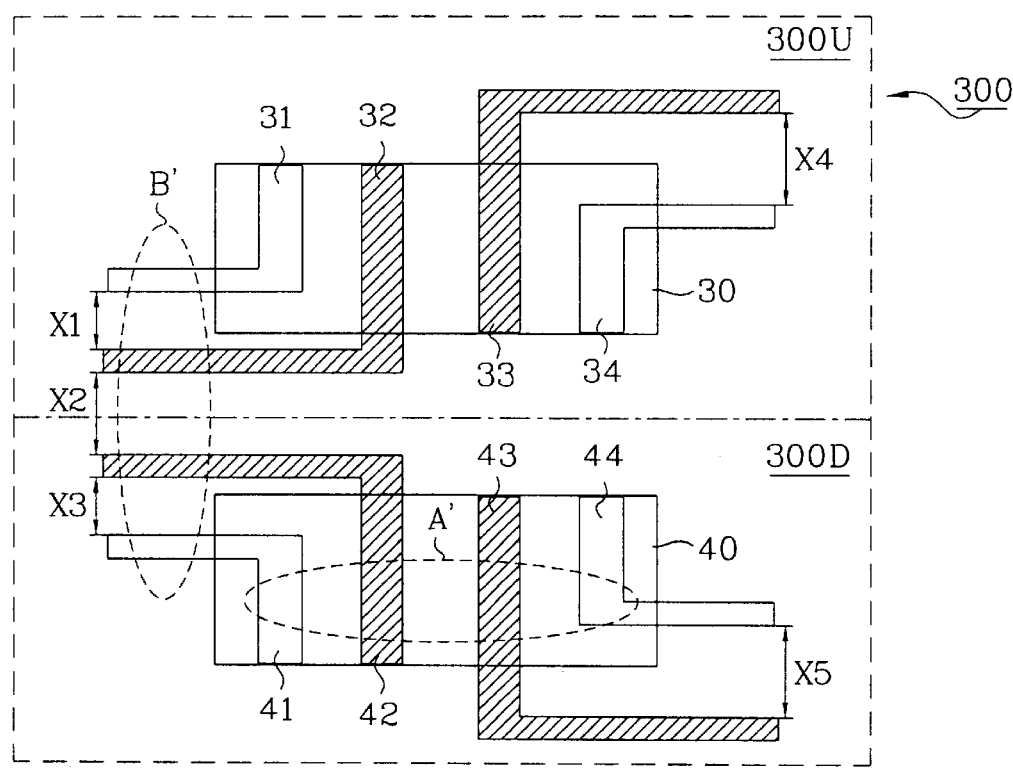
FIG. 6 is a plan view illustrating the layout structure of fuses in a laser fuse box of a semiconductor memory device in accordance with an embodiment of the present invention.

FIG. 6 illustrates a fuse layout structure in a laser fuse box of a semiconductor integrated circuit in accordance with a first embodiment of the present invention. As show in FIG. 6, there are fuse boxes 30 and 40 in first and second regions 300U, 300D in a semiconductor integrated circuit 300. The fuse boxes 30 and 40 include four laser fuses 31, 32–34, and 41, 42–44, respectively. As shown in FIG. 4, fuses 31, 34, 41, and 44 each have a bend located within the fuse box to solve the problem of electrical shorts between neighboring fuses. The other fuses 32, 33, 42, and 43 have no such bend within the respective fuses boxes. The fuses 32, 33, 42, and 43 having no such bend belong to a first group of laser fuses, and the other fuses 31, 34, 41, 44 having a bend belong to a second group of laser fuses. Therefore, in the fuse box 30, the neighboring laser fuses 32, 33 belonging to the first group of laser fuses are formed with a predetermined gap. The fuses 32, 33 each have a straight region within the fuse boxes 30 and 40. In addition, the laser fuses 31, 34 belonging to the second group of laser fuses are spaced apart with the laser fuses 32, 33 of the first group of laser fuses formed therebetween. Further, the fuses 31, 34 bend so as to extend horizontally to the left and right of the fuse box at a predetermined location in the fuse box 30.

According to the layout structure of fuses thus constructed, it can be found that the gap X1 between fuses 31, 32 in region B' of FIG. 6 is greater than the gap Y1 between fuses 11, 12 in corresponding region B of FIG. 4. In FIG. 6, the vertical runs of the bent fuses are preferably between approximately ½ and ⅔ of the length of the non-bent fuses within the fuse box. However, the length and configuration may be varied depending on the situation. The fuses can be made of polysilicon, polysilicon doped in n-type or p-type, or aluminum (Al), titanium (Ti), other kind of metal, or any other suitable material.

Since the gaps X1, X2, X3, X4, X5 shown in the layout structure of fuses in FIG. 6 are far greater than the corresponding gaps Y1, Y2, Y3, Y4, Y5 of FIG. 4, fuses on either side of a fuse to be blown can be protected by relatively thick oxide layers inside or outside the fuse box to minimize thermal conduction or influence that might cause damage. Therefore, the bent layout structure of fuses in a fuse box can solve the aforementioned problem of electrical shorts between neighboring fuses both within and outside the fuse boxes.

Figure 7:
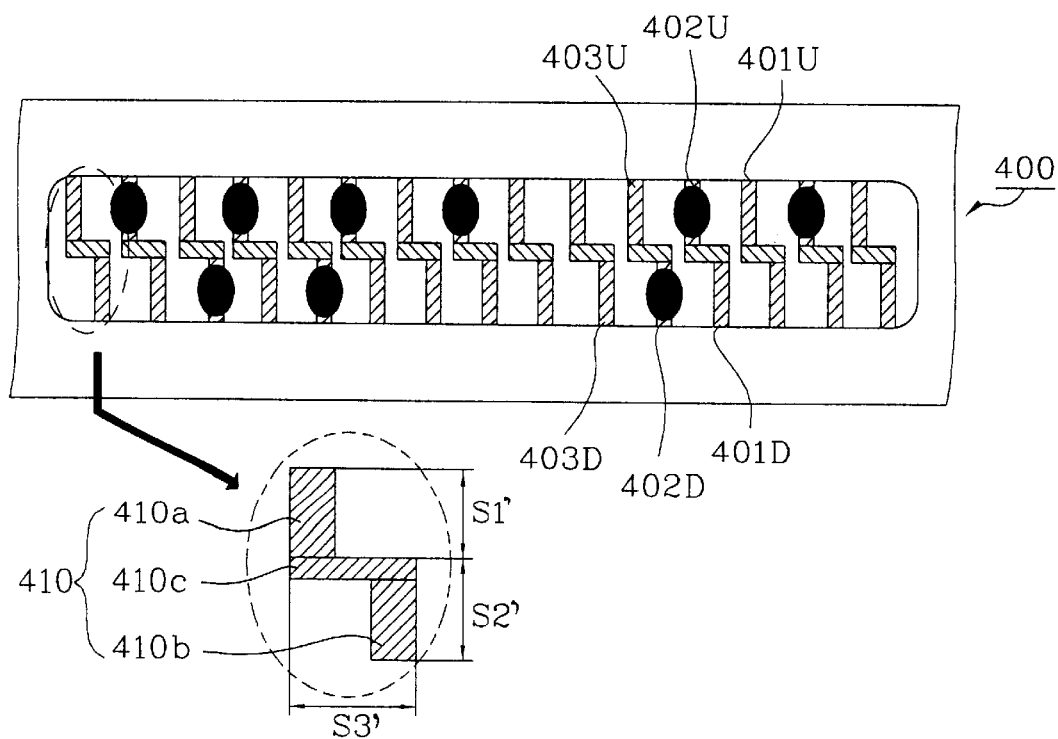
FIG. 7 is a plan view illustrating the layout structure of fuses and fusing positions in a laser fuse box of a semiconductor memory device in accordance with another embodiment of the present invention.

FIG. 7 illustrates a layout structure of fuses and fusing positions in a fuse box of a semiconductor integrated circuit in accordance with a second embodiment of the present invention that does not increase the occupancy area of a fuse box, but minimizes the thermal influence of a fusing process on neighboring fuses.

As shown in FIG. 7, there is a fuse box 400 including a plurality of fuses. One of the fuses contained in the fuse box 400 is enlarged and shown at the lower region of the drawing. In the layout structure of the fuse box 400 in accordance with the second embodiment of the present invention, a plurality of neighboring laser fuses are formed with a predetermined gap between adjacent fuses and formed in a bent shape to create fuse locations arranged in a staggered configuration. As shown in the enlarged drawing of a typical fuse 410, the fuse comprises a first region 410a, i.e., a region of the fuse to be blown which extends in a direction parallel to the width of the fuse box, from one edge of the fuse box 400 to its centerline; a second region 410c, i.e., a transverse region representing a bend, extending substantially, perpendicularly to the width of the fuse box 400 at an end of the first region 410a for protection thereof; and a third region 410b, i.e., a region of fuses to be blown which extends from the end of the second region 410c to the edge of the fuse box in a direction parallel to the first region 410a.

As shown in the drawings, the fuses contained in the fuse box 400 of the semiconductor integrated circuit are in the shape of a double bend, thus to provide two-dimensional offset, or staggered, fusing regions. The fusing process selectively blows the fuses in a zigzag manner. Thus, the thermal influence of the fusing process on the neighboring fuses can be minimized. In addition, there is no difference in the integration degree in the fuse box of bent fuses in comparison with the fuse box constructed in the structure shown in FIG. 5.

In FIG. 7, if a particular fuse 402D of the fuse box is blown, among those neighboring regions 401D, 401U, 402U, 403D, 403U, only the fuse 402U is targeted also for the fusing process. In other words, fuses 401D, 403D are not to be blown. If the fusing position of the odd-numbered fuses is in the upper regions of the fuses, then the fusing position of the even-numbered fuses is in the lower regions. Therefore, it is possible to prevent electrical shorts with neighboring fuses. The length of segments S1', S2', S3' of the fuse 410 are each approximately 2.0 cm. The combined length of S1' and S2' is to be the width of the fuse box, preferably approximately no less than 4 μm.

Figure 8:
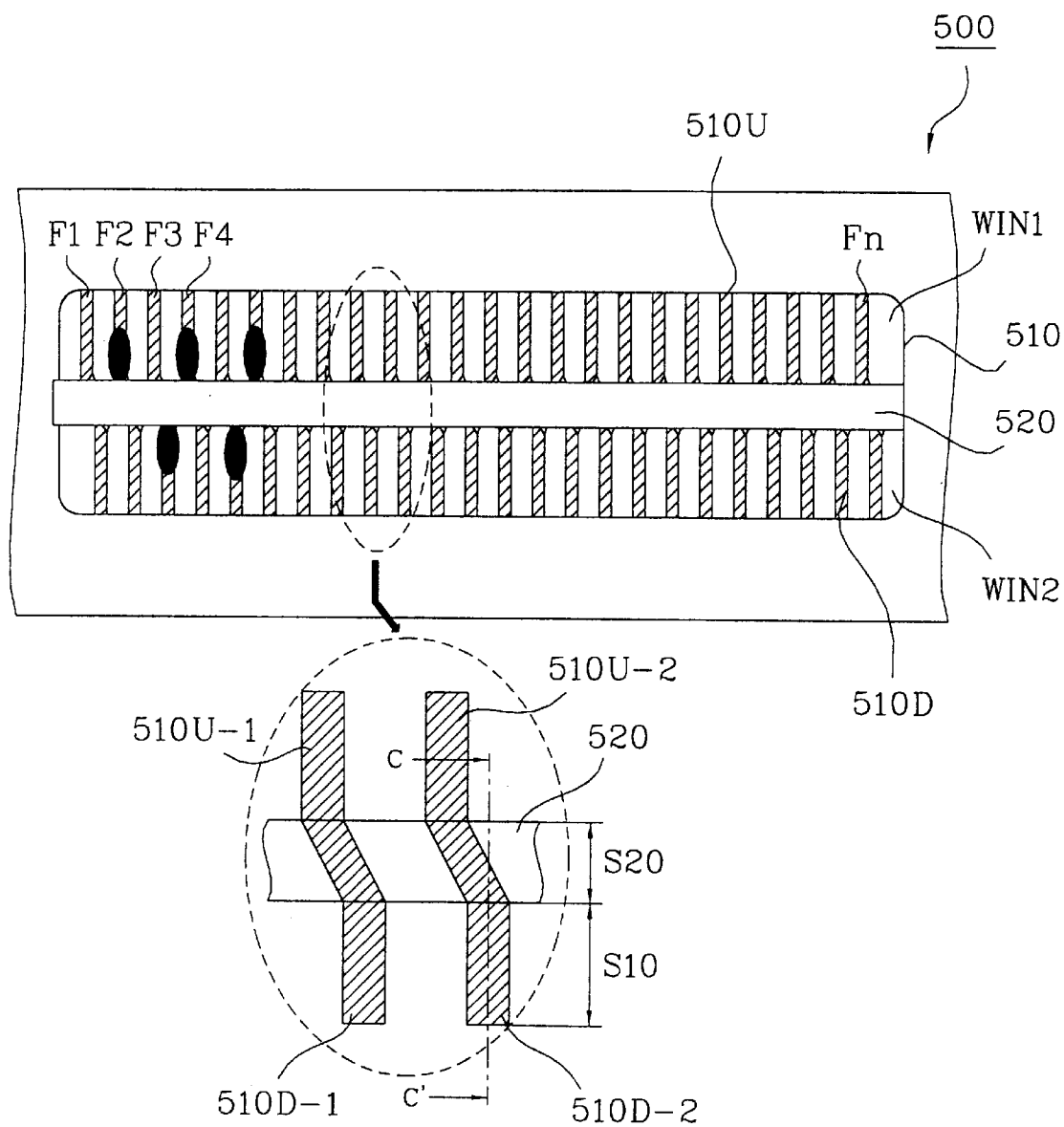
FIG. 8 is a plan view illustrating the layout structure of fuses and fusing positions in a laser fuse box of a semiconductor memory device in accordance with a third embodiment of the present invention.

FIG. 8 illustrates a layout structure and fusing positions in a laser fuse box of a semiconductor integrated circuit in accordance with a third embodiment of the present invention. As shown in FIG. 8, a fuse box 500 comprises a plurality of laser fuses F1 . . . Fn having a predetermined gap between adjacent fuses. The laser fuses have a central region extending parallel to each other for a given distance and then encountering a bend. And a protection line 520 extends in a direction parallel to the length of the fuse box 500 to cover the central fuse regions and the insulating layers between the central regions. Thus, the protection line 520 divides the fuse box 500 in half, forming two windows 510; WIN1, WIN2. Therefore, a fusing process can be selectively performed to the laser fuses in a zigzag manner to prevent or minimize the thermal damages to neighboring fuses.

In other words, to solve the electrical shorting problem noted above, the window 510 in the fuse box 500 is formed by covering an insulative protection layer and opening (exposing) the upper and lower regions of the fuse box 500 except the central region thereof. A region of the insulative protection layer, i.e., the protection line 520, is thus left at the central region of the fuse box 500, bordering and dividing the upper and lower regions thereof as a shield to protect the neighboring fuses from being damaged by a laser beam. As shown in an enlarged view in the bottom of FIG. 8, the width S20 of the protection line 520 is approximately 1.0 μm and the length S10 of a lower region of the fuse is approximately 2.0 μm. It is ideal that the windows be formed only over the fuses to be blown, but it is practically difficult to etch only the corresponding window area due to an increase in the integration degree of the semiconductor memory device. Such may be made possible with new etching techniques having higher precision.

In constructing the layout structures of a fuse box shown in FIGS. 6, 7 and 8 it may be necessary to set the sizes of all the regions within predetermined values according to spot sizes, which will be described now by reference to FIG. 5.

Figure 3A:
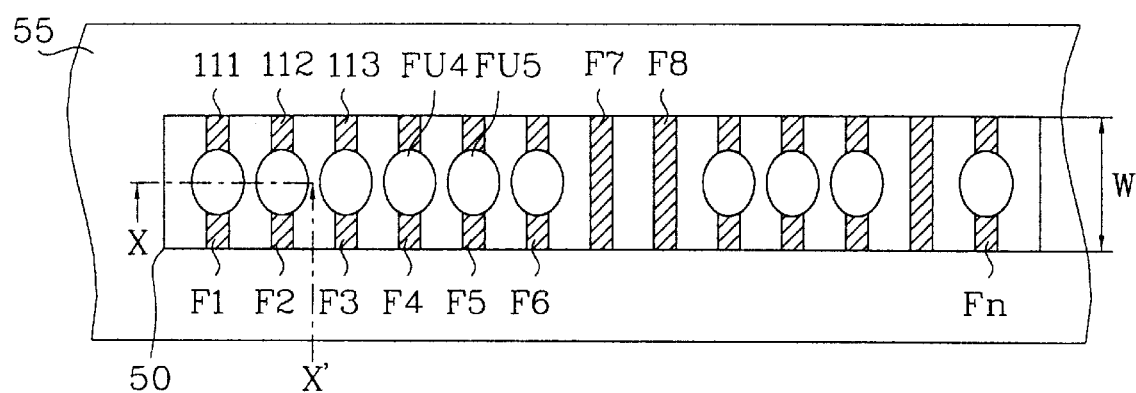
FIGS. 3A and 3B respectively are schematic and photographic profiles of defects that occur in programming a laser fuse box of a conventional semiconductor memory device.
Figure 3B:
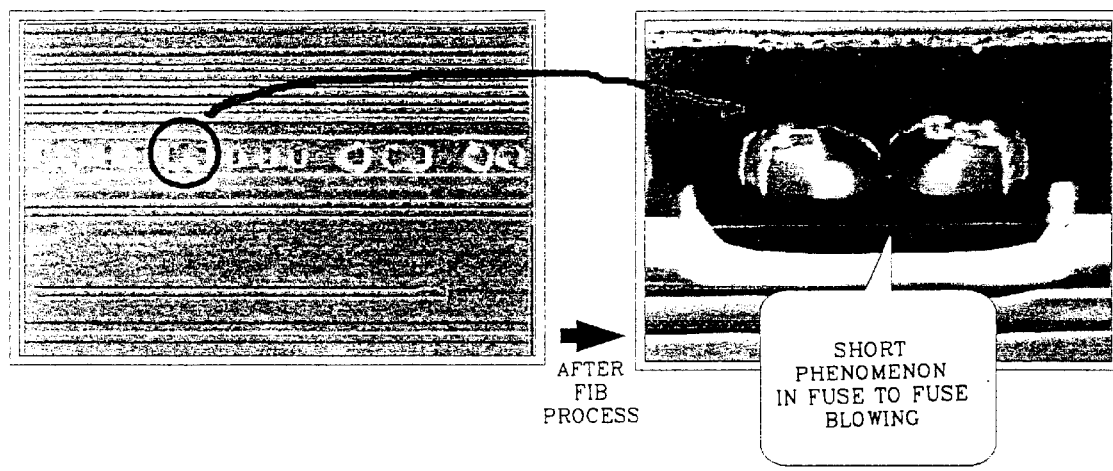
Figure 5:
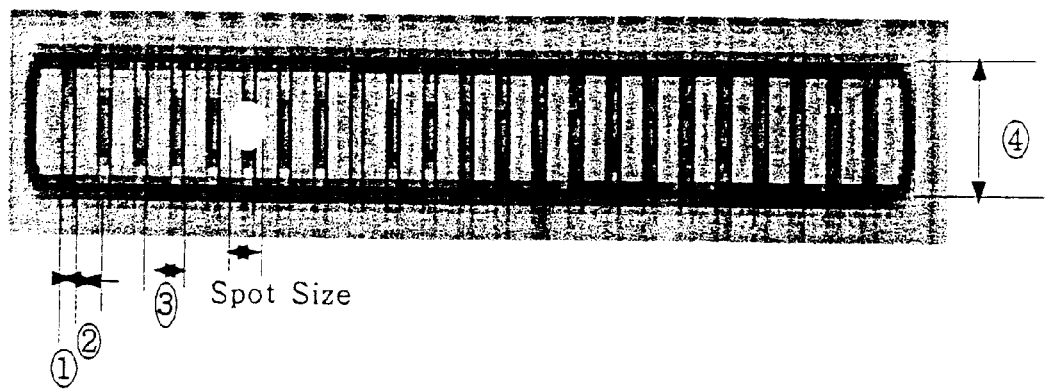
FIG. 5 illustrates an example of general fuse layout of the fuse box shown in FIG. 3A.

FIG. 5 illustrates some exemplary dimensions for the layout structure of a fuse box shown in FIG. 3A. In other words, in FIG. 5, recommended fuse widths and lengths and the gap and pitch between fuses according to a spot size set up for blowing laser fuses are illustrated. For instance, when the oxide layer over the fuse box is left at less than 8000 Å and polysilicon laser fuses are blown with M9200HT equipment manufactured by ESI Co., recommended specifications are as follows: the spot size of approximately 2.5–7.0 μm, the laser beam energy of approximately 0.2–1.5 μJ, and the focus of approximately 99 μm. If the aforementioned equipment is used for selectively blowing the fuses of FIG. 5 with the spot size of approximately 4.5 μm, the width 1 and length 4 of the fuses are preferably within the range of approximately 0.80–2.06 μm and approximately 5.5–7.4 μm, respectively. And the gap 2 and pitch 3 between fuses are preferably within the range of approximately 2.15–3.80 μm and approximately 3.15–4.0 μm, respectively. Thus, the illustration shown in FIG. 5 and the description thereto can be referred to set the sizes of all regions in fabricating the layout structures of fuse boxes as shown in FIGS. 6, 7 and 8.

Figure 9:
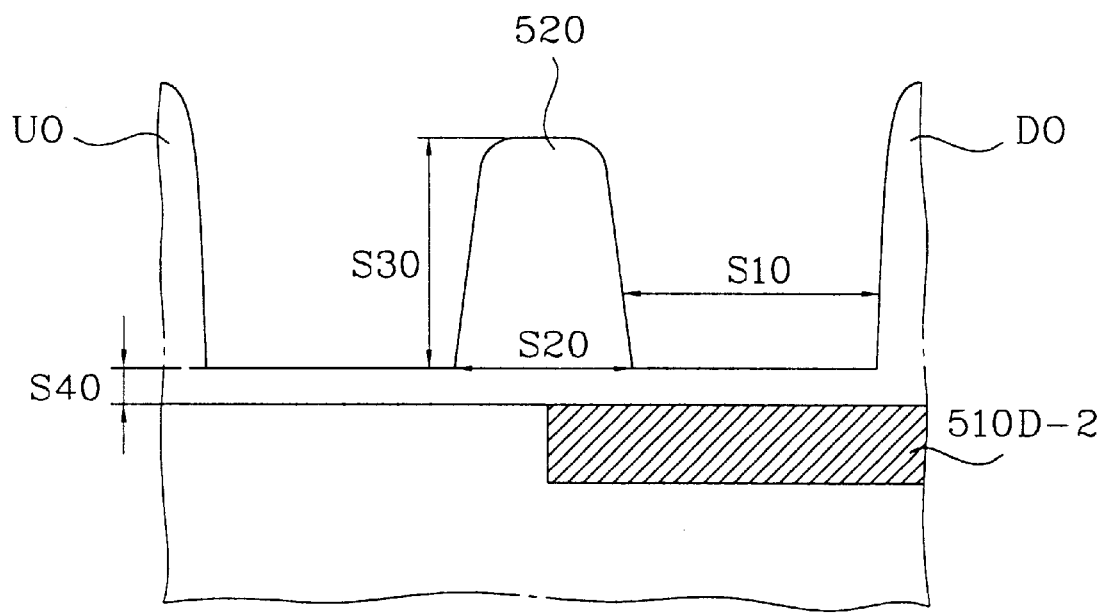
FIG. 9 is a cross-sectional view of the fuse box taken along line C–C' of FIG. 8.

FIG. 9 shows a cross-sectional view of the fuse box 500 taken along line C–C' of FIG. 8. The S30 indicating the height of the protection line 520 is preferably at approximately greater than 9000Å, sufficiently thick to block any influence of a laser beam. In addition, the upper region of the polysilicon fuse 510D-2 is not completely exposed by the etching process, but is covered by the insulating layer having a predetermined thickness S40. However, a predetermined region of fuses is partially etched out in the aforementioned embodiment to open the windows. Therefore, it should be noted that the scope of opening or forming windows in the present invention includes the structure in which the upper region of the fuses is not completely exposed. The thickness S40 of the insulating layer remaining in the window 510 is preferably less than approximately 8000 Å. Reference numerals UO and DO respectively indicate insulating layers and the oxide layers, at the upper and lower edges of the windows.

Figure 10A:
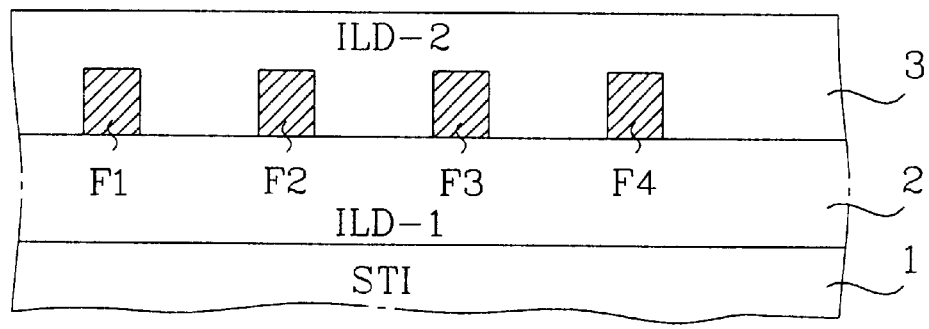
FIGS. 10A and 10B are cross-sectional views for illustrating operational processes of a method for fabricating the fuse box shown in FIG. 8.
Figure 10B:
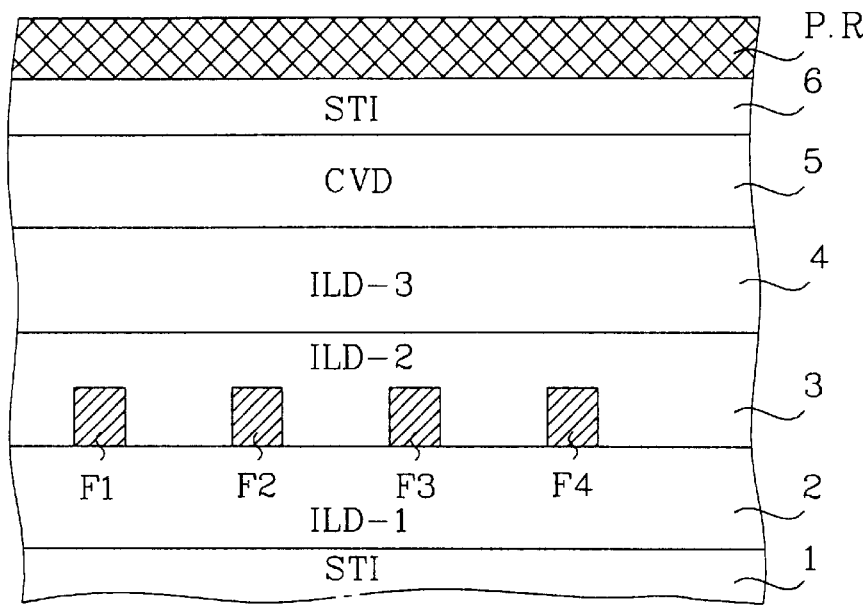

FIGS. 10A and 10B are cross-sectional views for illustrating a method for fabricating the fuse box shown in FIG. 8.

Referring to FIG. 10A, electronic circuit elements (not shown) is formed on a semiconductor substrate below a shallow trench insulating layer STI 1, wherein the electronic circuit elements are P-type or N-type MOS transistors in a semiconductor memory device. A first insulating interlayer (ILD-1) 2 is deposited over the insulating layer STI 1. Then, a polysilicon layer is deposited over the first insulating interlayer (ILD-1) 2 for forming bit lines of the semiconductor memory device. The fuses of FIG. 8 are made of the polysilicon layer during the aforementioned fabricating process at the periphery area in the chip. The polysilicon layer is patterned by a photo etching process into bit lines in the memory cell area and a layout structure including fuses F1, F2, F3, F4 in the periphery regions of the fuse circuit area. A second insulating interlayer (ILD-2) 3 is then deposited on the resultant structure.

As shown in FIG. 10B, a third insulating interlayer (ILD-3) 4, a chemical vapor deposition (CVD) layer 5, and a thin trench insulating layer 6 are sequentially deposited over the second insulating interlayer (ILD-2) 3. A passivation layer may be additionally deposited thereover. After fabricating the electronic circuit elements, the fuse box is opened for a later laser fusing process. To, this end, a photo resist layer PR is coated over the insulating layer (STI) 6. Then, a photolithography process is then performed thereto to obtain a photo resist mask pattern, which is used as a mask for performing an anisotropic dry etching process, e.g., reactive ion etching (RIE).

Figure 10C:
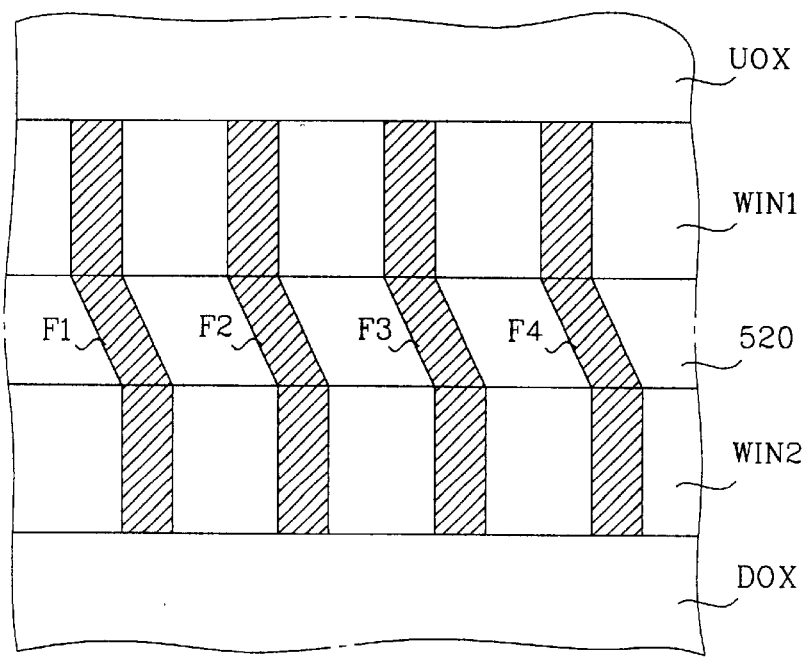
FIG. 10C is a plan view of a fuse box for illustrating the result of an etching process performed to FIG. 10B.

FIG. 10C is a plane view of a fuse box illustrating the result of the etching process performed to the structure shown in FIG. 10B, depicting two windows WIN1, WIN2. After fabrication of the fuse boxes of FIG. 8, a predetermined number of fuses in the fuse box are selectively blown.

If the targeted fuses are odd numbered fuses F1, F3, a fusing process is performed to a region 510D of the fuses shown through one window WIN2. If the targeted fuses are even-numbered fuses F2, F4, a fusing process is performed to a region 510U of the fuses shown through the other window WIN1. As described above, fusing is done in a region of the fuses, which borders the protection line 520 in a zigzag manner.

According to the novel features of the preferred embodiments of the present invention, the protection line 520 is left between the windows WIN1 and WIN 2. Although a method for fabricating the window structure has been described with reference to FIG. 8, the protection line 520 can be separately formed by a chemical vapor deposition method depending on situations.

According to the first, second and third embodiments described, the fuse boxes of the present invention occupy a smaller area of the semiconductor integrated circuit than prior art, and facilitate the fusing process. The fusing process can be performed to the fuses contained in the aforementioned structure of the fuse box, thereby preventing or minimizing any thermal damage to neighboring fuses.

Having described a preferred embodiment of the invention with reference to the accompanying drawings, it is to be understood that the invention is not limited to the aforementioned specific embodiments, and that various changes and modifications of other embodiments may be effected therein by one skilled in the art without departing from the spirit and scope of the present invention as defined in the appended claims. For instance, the polysilicon fuse may be replaced with another element or a metal/non-metal layer. The rectangular pattern for opening the windows may be replaced with any other shape such as an oval shape. Also, when the fuse box is applied to a dynamic random access memory as described above, it can also be used as a redundancy signal generating circuit, a signature circuit to indicate the necessity of a repair process, a specific mode of a non-accessible signal generating circuit or a specific parameter of a voltage adjustment circuit.

What is claimed is:

1. A method for selectively fusing fuses in a fuse box of a semiconductor integrated circuit in a zigzag manner, a plurality of odd and even numbered neighboring fuses being formed with a predetermined gap therebetween to create fuse locations arranged in a staggered configuration, the fuse comprising: a first conductive region extending from one edge of the width of the fuse box to an approximate centerline of the fuse box; a second conductive region extending longitudinally from an end of the first region; and a third conductive region extending from an end of the second region to the edge of the fuse box, the method comprising:

fusing the first conductive region of the fuses if the odd numbered fuses of the laser fuses are selectively targeted for the fusing process; and fusing the second conductive region of the fuses if the even numbered fuses of the laser fuses are selectively targeted for the fusing process.

2. The method, as defined in claim 1, wherein the laser fuse box of the semiconductor integrated circuit is provided for generating a redundancy signal to replace a normal memory cell with a redundancy memory cell if the normal memory cell is defective.

3. A method for selectively fusing fuses in a fuse box of a semiconductor integrated circuit, a plurality of odd and even numbered neighboring fuses being formed with a predetermined gap in the fuse box, the fuses having a central region extending parallel to each other, and an insulative protection line extending longitudinally within the fuse box to cover the central regions and insulating layers therebetween, thereby dividing the fuse box into two windows:

fusing a region of the odd numbered fuses shown through one of the two windows if the odd numbered fuses are selected for fusing; and fusing a region of the even numbered fuses shown through the other window of the two windows if the even numbered fuses are selected for fusing so as to perform a fusing process in a zigzag manner.

4. The method, as defined in claim 3, wherein the laser fuses are made of polysilicon.

5. The method, as defined in claim 3, wherein the semiconductor integrated circuit is a semiconductor memory device.

6. The method, as defined in claim 3, wherein the thickness of the protection layer is greater than approximately 9000 Å.

7. The method, as defined in claim 5, wherein the laser fuses are formed at the same time when bit lines of the semiconductor memory device are made of polysilicon.

8. A method for fabricating a laser fuse box of a semiconductor integrated circuit comprising:

depositing a first insulating layer over a semiconductor substrate having electronic circuit elements thereon;

depositing and patterning a silicon layer on the first insulating layer to form a plurality of fuses;

forming a second insulating layer on the plurality of fuses; and selectively etching the second insulating layer to a predetermined depth to form windows that define the fuse box, the windows divided into two open regions extending longitudinally in the fuse box, the windows extending along either side of the central regions of the fuses, the central regions of the fuses being covered by the second insulating layer.

9. The method, as defined in claim 8, wherein the silicon layer is a doped polysilicon layer.

10. The method, as defined in claim 8, wherein the electronic circuit elements are a plurality of MOS transistors forming a semiconductor memory device.

11. The method, as defined in claim 8, wherein the thickness of the second insulating layer selectively etched in the windows is less than approximately 8000 Å and that of the second insulating layer in the central region of the fuse box is greater than approximately 9000 Å.

12. The method, as defined in claim 9, wherein the doped polysilicon layer is formed simultaneously with the bit lines of the semiconductor memory device.

13. The method, as defined in claim 8, wherein the second insulating layer includes a passivation layer.

14. A method for fabricating a laser fuse box of a semiconductor integrated circuit comprising:

depositing a first insulating layer over a semiconductor substrate having electronic circuit elements thereon;

depositing and patterning a silicon layer on the first insulating layer to form a plurality of laser fuses;

forming a second insulating layer on the plurality of laser fuses;

selectively etching the second insulating layer to a predetermined depth to form one or more windows for an opening in the fuse box; and selectively depositing a third insulating layer at the central regions of the fuses in the windows.

15. The method, as defined in claim 14, wherein the third insulating layer is formed of oxide.

* * * * *

UNITED STATES PATENT AND TRADEMARK OFFICE
CERTIFICATE OF CORRECTION

PATENT NO.     : 6,682,959 B2
DATED          : January 27, 2004
INVENTOR(S)    : Bang et al.

It is certified that error appears in the above-identified patent and that said Letters Patent is hereby corrected as shown below:

<u>Column 7,</u>
Line 7, "2.0 cm. The" should read -- 2.0 $\mu$m. The --.

<u>Column 8,</u>
Line 44, "To, this end," should read -- To this end, --.

Signed and Sealed this

Twenty-seventh Day of July, 2004

JON W. DUDAS
*Acting Director of the United States Patent and Trademark Office*